(12) United States Patent
Chen et al.

(10) Patent No.: US 10,276,395 B2
(45) Date of Patent: Apr. 30, 2019

(54) METHOD FOR MANUFACTURING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chien-Hao Chen, Tainan (TW); Feng-Lun Wu, Taichung (TW); Chung-Ping Hsia, New Taipei (TW); Sho-Shen Lee, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/928,078

(22) Filed: Mar. 21, 2018

(65) Prior Publication Data

US 2018/0286692 A1    Oct. 4, 2018

(30) Foreign Application Priority Data

Mar. 29, 2017    (CN) .......................... 2017 1 0197192

(51) Int. Cl.
| | |
|---|---|
| *H01L 21/30* | (2006.01) |
| *H01L 21/308* | (2006.01) |
| *H01L 21/027* | (2006.01) |
| *G03F 7/09* | (2006.01) |
| *H01L 23/544* | (2006.01) |
| *H01L 27/105* | (2006.01) |

(52) U.S. Cl.
CPC .......... *H01L 21/3088* (2013.01); *G03F 7/091* (2013.01); *H01L 21/0276* (2013.01); *H01L 21/3085* (2013.01); *H01L 21/3086* (2013.01); *H01L 23/544* (2013.01); *H01L 27/105* (2013.01); *H01L 2223/54426* (2013.01)

(58) Field of Classification Search
CPC .......................... H01L 21/0276; H01L 27/105
See application file for complete search history.

(56) References Cited

U.S. PATENT DOCUMENTS

| | | | |
|---|---|---|---|
| 7,452,825 | B2 | 11/2008 | Lee |
| 7,709,396 | B2 | 5/2010 | Bencher |
| 9,355,923 | B2 | 5/2016 | Yoshino |

(Continued)

*Primary Examiner* — Caridad Everhart
*Assistant Examiner* — Ankush K Singal
(74) *Attorney, Agent, or Firm* — Winston Hsu

(57) ABSTRACT

The present invention provides a method for manufacturing a semiconductor device including following steps. A substrate, a hard mask layer disposed on the substrate and a first mask pattern disposed on the hard mask layer are provided, and the substrate has a device region and a cutting line region. The first mask pattern has first gaps in the device region and second gaps in the cutting line region. Next, a spacer layer conformally covers the first mask pattern. Then, a second mask pattern is formed on the spacer layer in the first gaps, and a top surface of the second mask pattern is lower than a top surface of the first mask pattern. Thereafter, an etching process is performed to the spacer layer to remove the spacer layer between the first mask layer and the second mask layer and in the second gaps and expose the hard mask layer.

9 Claims, 5 Drawing Sheets

(56) References Cited

U.S. PATENT DOCUMENTS

| | | | |
|---|---|---|---|
| 2003/0051225 A1* | 3/2003 | Mori | G03F 1/36 430/5 |
| 2009/0118857 A1* | 5/2009 | Bischoff | G01B 11/24 700/110 |
| 2016/0196974 A1* | 7/2016 | Seong | H01L 21/3086 257/618 |
| 2016/0196982 A1* | 7/2016 | Kang | H01L 21/02595 438/702 |
| 2016/0254153 A1* | 9/2016 | Park | H01L 21/0338 438/695 |
| 2016/0358861 A1 | 12/2016 | Conklin | |
| 2018/0175063 A1* | 6/2018 | Lee | H01L 27/1203 |

* cited by examiner

METHOD FOR MANUFACTURING SEMICONDUCTOR DEVICE

CROSS REFERENCE TO RELATED APPLICATION

The present application claims the priority benefit of Chinese patent application serial no. 201710197192.3, filed Mar. 29, 2017. The entirety of the above-mentioned patent application is hereby incorporated by reference herein.

BACKGROUND OF THE INVENTION

1. Field of the Invention

The present invention relates to a method for manufacturing a semiconductor device, and more particularly, to a method for manufacturing a semiconductor device to increase resolution of alignment mark.

2. Description of the Prior Art

In semiconductor processes, in order to accurately project a pattern on a required position of a wafer, the wafer needs to be aligned before exposure, and the wafer needs alignment marks formed thereon for aligning. The alignment mark is generally aligned and detected by an optical image device, and accordingly, the accuracy and resolution of the alignment mark affect alignment error. A pattern of the alignment mark formed by a self-aligned reverse pattern (SARP) technology is a circular trench, and as size of device trench formed with the alignment mark becomes smaller, trench width of the alignment mark also becomes smaller, thereby reducing the resolution of the alignment mark.

SUMMARY OF THE INVENTION

It is therefore an objective of the present invention to provide a method for manufacturing a semiconductor device to increase the resolution of the alignment mark.

An embodiment of the present invention provides a method for manufacturing a semiconductor device. First, a substrate, a hard mask layer disposed on the substrate and a first mask pattern disposed on the hard mask layer are provided, and the substrate has a device region and a cutting line region. The first mask pattern includes a plurality of strip-shaped device patterns and a plurality of strip-shaped alignment patterns, in which each strip-shaped device pattern is disposed along a first direction in the device region, the strip-shaped device patterns are arranged along a second direction, each strip-shaped alignment pattern is disposed along the first direction in the cutting line region, and the strip-shaped alignment patterns are arranged along the second direction. A first gap exists between any two of the strip-shaped device patterns adjacent to each other, a second gap exists between any two of the strip-shaped alignment patterns adjacent to each other, and a width of each second gap is greater than a width of each first gap. Thereafter, a spacer layer is formed to conformally cover the first mask pattern. A second mask pattern is then formed on the spacer layer in the first gaps, and a top surface of the second mask pattern is lower than a top surface of the first mask pattern. Following that, a first etching process is performed on the spacer layer to remove a part of the spacer layer between the first mask pattern and the second mask pattern and another part of the spacer in the second gaps so as to expose the hard mask layer. Later, the hard mask layer is patterned by using the first hard mask pattern and the second mask pattern as a mask to form a hard mask pattern. After that, the substrate is etched by using the hard mask pattern as another mask to form a plurality of first trenches and a plurality of second trenches in the substrate, in which a depth of each second trench is greater than a depth of each first trench.

In the method of manufacturing the semiconductor device of the present invention, the mask material layer in the second gaps and the third gap are removed, and the second mask pattern which top surface is lower than the top surface of the first mask pattern remains in the first gap when the mask material layer in the peripheral region is fully removed, such that the following pattern transferring process may form the fourth trench which depth is deeper than the depth of the third trench in the semiconductor substrate in the cutting line region. Accordingly, an image contrast between the alignment mark structure and the fourth trenches may be increased, thereby improving optical resolution.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
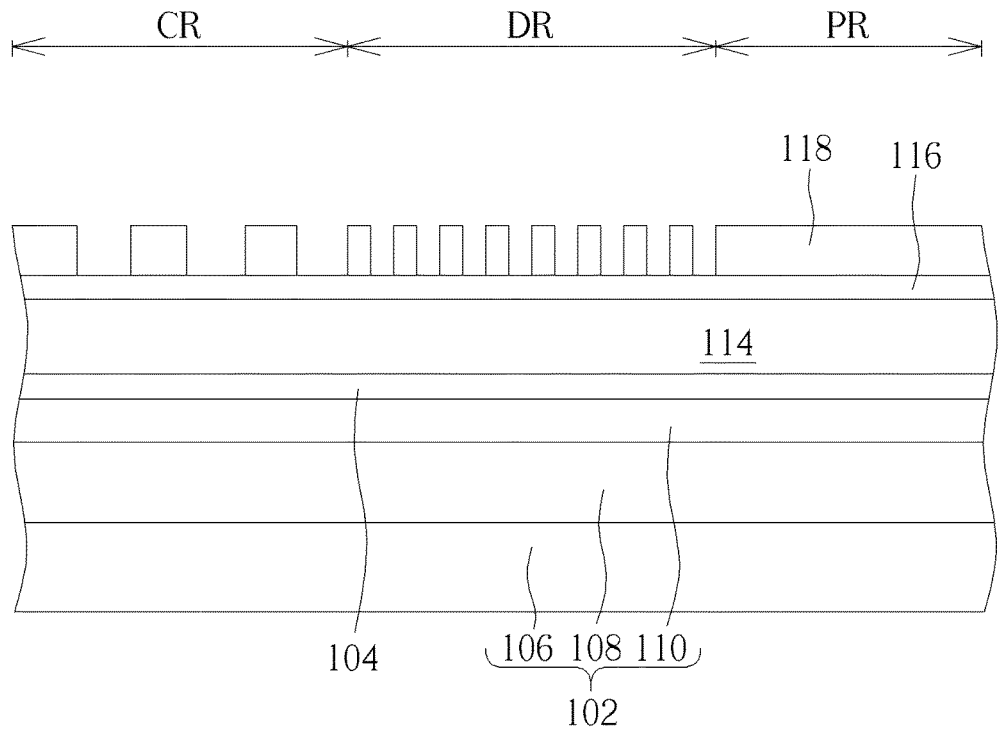
FIG. 1 to FIG. 9 schematically depict a method of manufacturing a semiconductor device according to an embodiment of the present invention.
Figure 2:
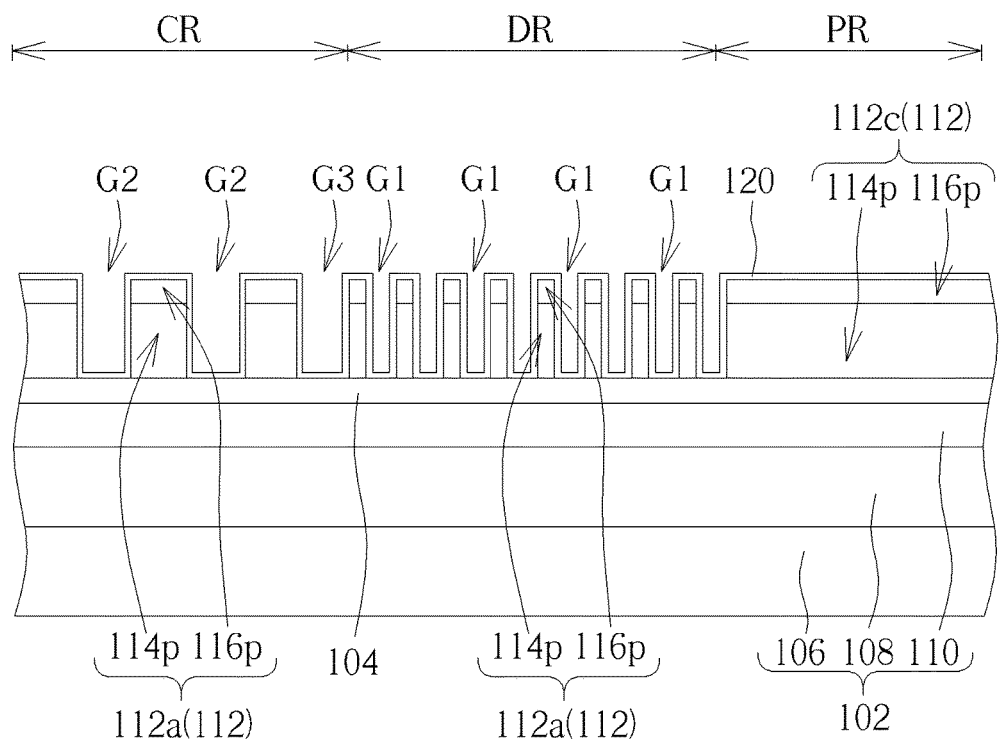
Figure 3:
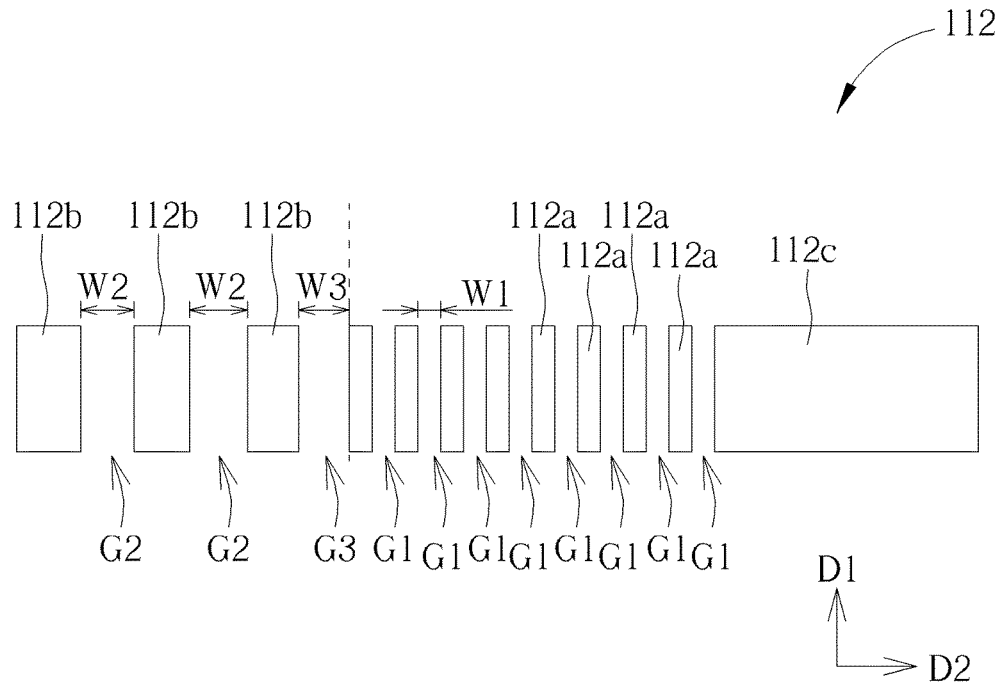

Referring to FIG. 1 to FIG. 9, FIG. 1 to FIG. 9 schematically depict a method of manufacturing a semiconductor device according to an embodiment of the present invention, in which FIG. 3 schematically illustrates a cross-sectional view of a first mask pattern according to the embodiment. First, a substrate 102, a hard mask layer 104 and a first mask pattern 112 are provided. The hard mask 104 is disposed on the substrate 102, and the first mask pattern 112 is disposed on the hard mask layer 104. Specifically, as shown in FIG. 1, the hard mask layer 104 is first formed on the substrate 102. The substrate 102 at least has a device region DR and a cutting line region CR. The substrate 102 in the device region DR may be used to form main devices thereon, such as memory cells. The cutting line region CR is a region for performing cutting and removing after finishing the main devices in the device region DR, and thus, the substrate in the cutting line region CR may have alignment mark formed thereon before removing the cutting line region CR, which helps to make a relative position between the different patterns aligned while performing different patterning processes be accurate.

In this embodiment, the substrate 102 may include a semiconductor substrate 106, an oxide layer 108, and a pattern transferring layer 110, and the oxide layer 108 and the pattern transferring layer 110 are sequentially stacked on the semiconductor substrate 106. The semiconductor substrate 106 may for example include silicon or be a silicon epitaxial layer or a silicon-on-insulator substrate, but the present invention is not limited thereto. The hard mask layer 104 is used for transferring the mask pattern formed in the following step to the substrate 102 and serves as an etching stop layer. For example, the hard mask layer 104 may include silicon nitride. In this embodiment, besides the device region DR and the cutting line region CR, the substrate 102 may further have a peripheral region PR, and the hard mask layer 104 covers the device region DR, the cutting line region CR and the peripheral region PR.

After that, as shown in FIG. 2, a first mask pattern 112 is formed on the hard mask layer 104. In this embodiment, the method for forming the first mask pattern 112 may include the following steps. First, as shown in FIG. 1, an organic layer 114 and a silicon-containing layer 116 are sequentially formed to cover the hard mask layer 104, in which the organic layer 114 may for example include an organic material, and the silicon-containing layer 116 may for example be a silicon-containing hard mask bottom anti-reflective coating (SHB) layer for reducing reflected light between a photoresist pattern 118 formed in the following step and the substrate 102. Then, the photoresist pattern 118 is formed on the silicon-containing layer 116. Thereafter, as shown in FIG. 2, the silicon-containing layer 116 is patterned by using the photoresist pattern 118 as a mask to form a silicon-containing pattern 116p. Subsequently, the organic layer 114 is patterned by using the silicon-containing pattern 116p as another mask to form an organic pattern 114p and remove the photoresist pattern 118, and accordingly the first mask pattern 112 is formed. Through the above-mentioned steps, the first mask pattern 112 may have substantially the same pattern as the photoresist pattern 116, but the method for forming the first mask pattern 112 of the present invention is not limited to the above steps.

As shown in FIG. 3, the first mask pattern 112 of this embodiment may include a plurality of strip-shaped device patterns 112a, a plurality of strip-shaped alignment patterns 112b and a peripheral pattern 112c. Each strip-shaped device pattern 112a is disposed along a first direction D1 and in the device region DR, and the strip-shaped device patterns are arranged along a second direction D2. Each strip-shaped alignment pattern 112b is disposed along the first direction D1 and in the cutting line region CR, and the strip-shaped alignment patterns are arranged along the second direction D2. A first gap G1 exists between any two of the strip-shaped device patterns 112a adjacent to each other, a second gap G2 exists between any two of the strip-shaped alignment patterns 112b adjacent to each other, and a width W2 of each second gap G2 is greater than a width W1 of each first gap G1. For example, the width W2 of the second gap G2 is 20 times greater than the width W1 of the first gap G1. The width W2 of each second gap G2 may be for example 1 micrometer, and the width W1 of each first gap G1 may be for example 50 nanometers. Or, the width W2 of each second gap G2 may be 50 times, 100 times or 500 times greater than the width W1 of the first gap G1, but the present invention is not limited thereto. In this embodiment, the strip-shaped device patterns 112a and the strip-shaped alignment patterns 112b may be arranged along the second direction D2. A third gap G3 may selectively exist between one of the strip-shaped device patterns 112a closest to the strip-shaped alignment patterns 112b and one of the strip-shaped alignment patterns 112b closest to the strip-shaped device patterns 112a, and a width W3 of the third gap G3 may also be 20 times greater than the width W1 of each first gap G1. For example, the width W3 of the third gap G3 may be identical to the width W2 of each second gap G2, but the present invention is not limited thereto.

After the first mask pattern 112 is formed, a deposition process is performed to form a spacer layer 120 to conformally cover the first mask pattern 112. The spacer layer 120 may for example include silicon oxide, and the deposition process may be for example an atomic layer deposition (ALD) process, but the present invention is not limited thereto. Since the spacer layer 120 conformally covers the hard mask layer 104 and the first mask pattern 112 under the condition that the spacer layer 120 doesn't fill up the first gaps G1, the second gaps G2 and the third gap G3, a thickness of the spacer layer 120 may be at least less than a half of the width W1 of each first gap G1.

Figure 4:
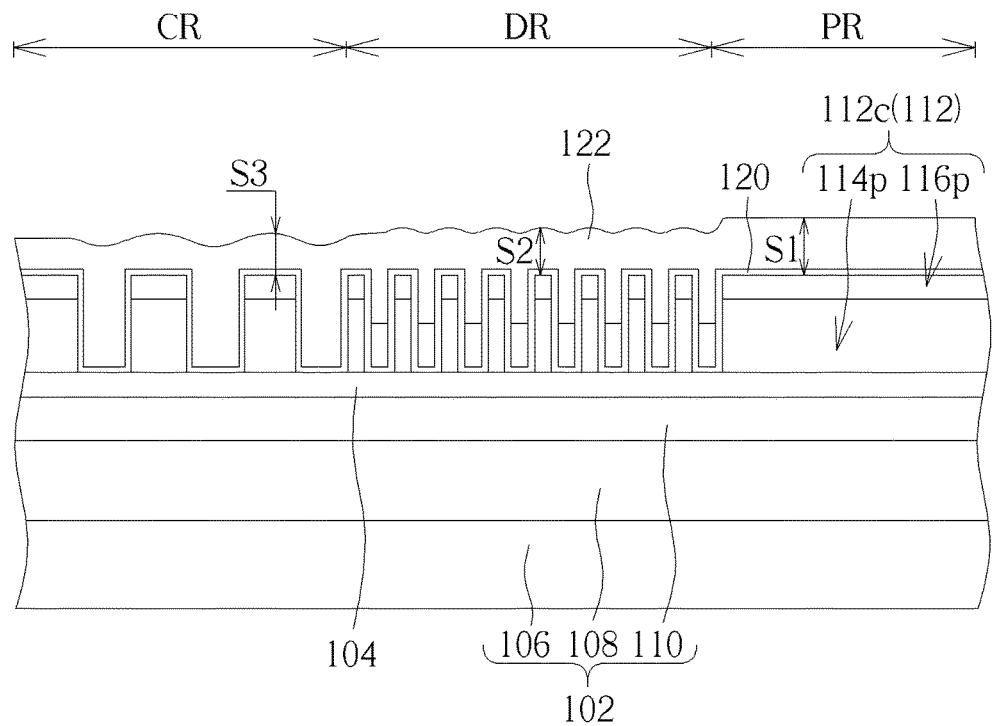
Figure 5:
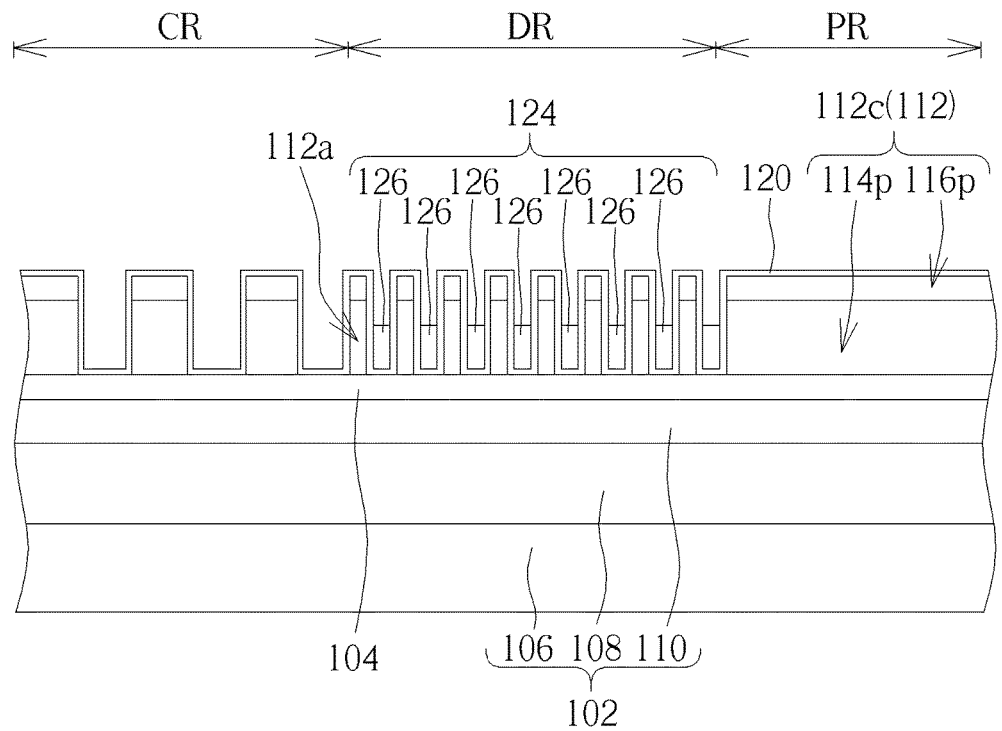

After the spacer layer 120 is formed, a second mask pattern 124 is formed on the spacer layer 120 in the first gaps G1, in which a top surface of the second mask pattern 124 is lower than a top surface of the first mask pattern 112. Specifically, the method for forming the second mask pattern 124 is detailed in the following steps, but the present invention is not limited thereto. As shown in FIG. 4, after the spacer layer 120 is formed, a mask material layer 122 is formed on the spacer layer 120. The mask material layer 122 may include a material with a high etching selectivity ratio relative to the spacer layer 120 and the hard mask layer 104, such that the mask material layer 122 may serve as a mask pattern when removing the spacer layer 120 and the hard mask layer 104. For example, the material may be formed of a same organic material as the organic layer 114, but the present invention is not limited thereto. In this embodiment, the mask material layer 112 fills up the first gaps G1, the second gaps G2 and the third gap G3 and further covers the first mask pattern 112. It is noted that since the first gaps G1, the second gaps G2 and the third gap G3 are not filled up with the spacer layer 120, a top surface of a part of the mask material layer 122 in the device region DR and the cutting line region CR is not a planar surface, but a wavy surface. Furthermore, because the width W2 of each second gap G2 and the width W3 of the third gap G3 20 times greater than the width W1 of each first gap G1, and no gap exists in the peripheral region PR, the top surface of the formed mask material layer 120 not only is wavy in the device region DR and the cutting region CR, but also inclines from the peripheral region PR toward the cutting line region CR, which means a spacing S1 spaced between the top surface of the mask material layer 120 in the peripheral region PR and the top surface of the first mask pattern 112 is greater than a spacing S2 spaced between the top surface of the mask material layer 120 in the device region DR and the top surface of the first mask pattern 112, and the spacing S2 is greater than a spacing S3 spaced between the top surface of the mask material layer 122 in the cutting line region CR and the top surface of the first mask pattern 112. Thereafter, as shown in FIG. 5, a second etching process is performed on the mask material layer 122 to remove a part of the mask material layer 122 on the first mask pattern 112 and another part of the mask material layer 122 in the second gaps G2 and the third gap G3, so as to form a second mask pattern 124 in each first gap G1 and expose the spacer layer 120. Specifically, the second etching process is performed fully, and no mask pattern is formed on the mask material layer 122, so the second etching process may fully remove the another part of the mask material layer 122 in the second gaps G2 and the third gap G3, and the second mask pattern 124 remaining in each first gap G1 covers a bottom of each first gap G1. It is noted that since the top surface of the mask material layer 120 in the cutting line region CR is lower than the top surface of the mask material layer 120 in the device region DR, and the width W2 of each second gap G2 is 20 times greater than the width W1 of each first gap G1, the etching rate to the mask material layer 122 in each second gap G2 is faster than the etching rate to mask material layer 122 in each first gap G1. Thus, after the mask material layer 122 in the peripheral region PR is fully removed, the mask material layer 122 in the second gaps G2 and the third gap G3 is also then removed, and part of the mask material layer 122 that is the formed second mask pattern 124 remains in the first gaps G1. In such situation, the second mask pattern 124 may include a plurality of blocks 126 in the first gaps G1 respectively, and a top surface of each block 126 is lower than the top surface of the first mask pattern 112. Moreover, a width of each block 126 may be adjusted by the thickness of the spacer layer 120 and the width W1 of each first gap G1. For example, the width of each block 126 may be the same as the width of each strip-shaped device pattern 1112a in the second direction D2, such that widths of fin structures formed in the device region DR by the following step may be identical to each other, but the present invention is not limited thereto.

Figure 6:
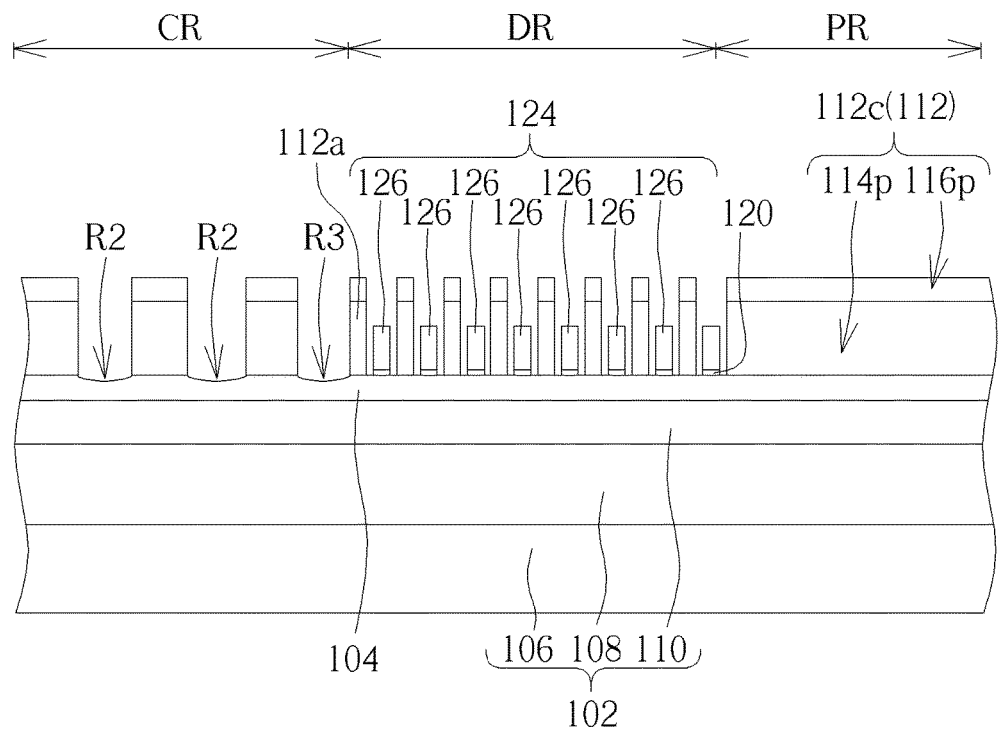

As shown in FIG. 6, a first etching process is then performed on the spacer layer 120 to remove the exposed spacer layer 120 which is a part of the spacer layer 120 between the first mask pattern 112 and the second mask pattern 124, another part of the spacer layer 120 in the second gaps G2 and another part of the spacer layer 120 on the first mask pattern 112 so as to expose the hard mask layer 104. For example, the first etching process may be an anisotropic etching process, so the spacer layer 120 under the second mask pattern 124 can remain. Since the etching rate to the spacer layer 120 in the second gaps G2 is faster than the etching rate to the spacer layer 120 in the first gaps G1, the hard mask layer 104 corresponding to each second gap G2 may be exposed first, such that the first etching process will further etch and remove part of the hard mask layer 104 exposed by each second gap G2 and form a plurality of first recesses R1 on the hard mask layer 104. Each first recess R1 corresponds to one second gap G2. Similarly, a third recess R3 may be formed on the hard mask layer 104 corresponding to the third gap G3.

Figure 7:
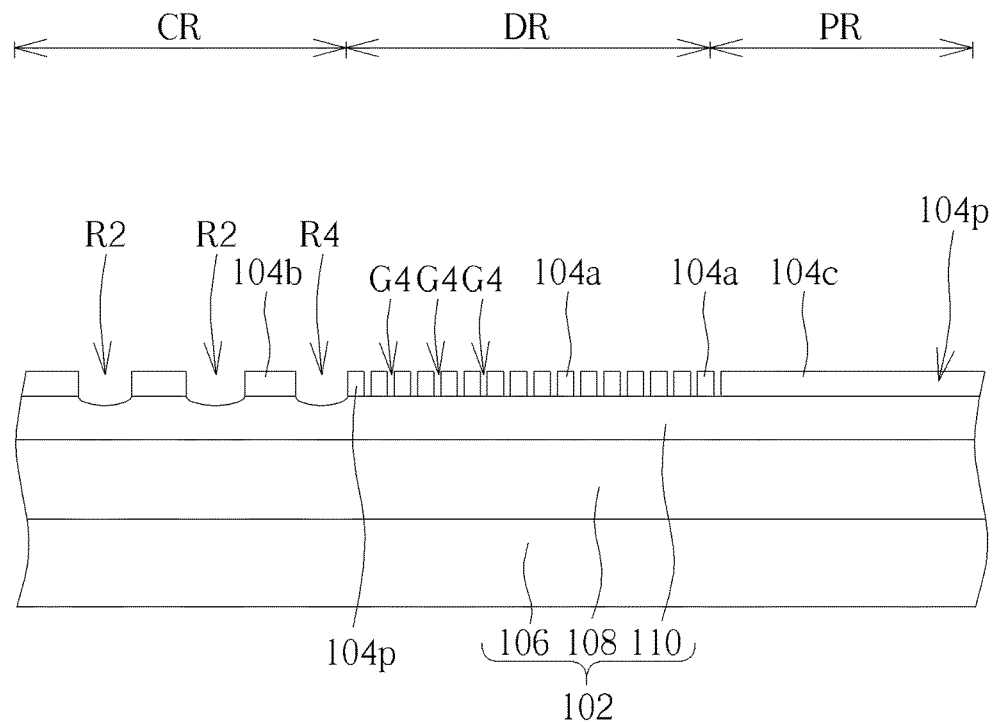

As shown in FIG. 7, after the first etching process, the first mask pattern 112 and the second mask pattern 124 are used as a mask to pattern the hard mask layer 104 so as to form a hard mask pattern 104p. The hard mask pattern 104p has a pattern constituted by the first mask pattern 112 and the second mask pattern 124, so the pattern can be transferred to the substrate 102 under the hard mask pattern 104p. Specifically, the hard mask pattern 104p may has a plurality of strip-shaped device mask 104a, a plurality of strip-shaped alignment mask 104b and a peripheral mask 104c. A fourth gap G4 exists between any two adjacent strip-shaped device mask 104b, and a width of the fourth gap G4 may be substantially identical to the thickness of the spacer layer 120. Furthermore, because the hard mask layer 104 in the cutting line region CR has the first recesses R1 formed thereon, when the hard mask pattern 104 is patterned, a plurality of second recesses R2 may be formed on part of the pattern transferring layer 110, and the second recesses R2 correspond to the first recesses R1 respectively. Similarly, a fourth recess R4 may be formed on the pattern transferring layer 110 corresponding to the third recess R3.

Figure 8:
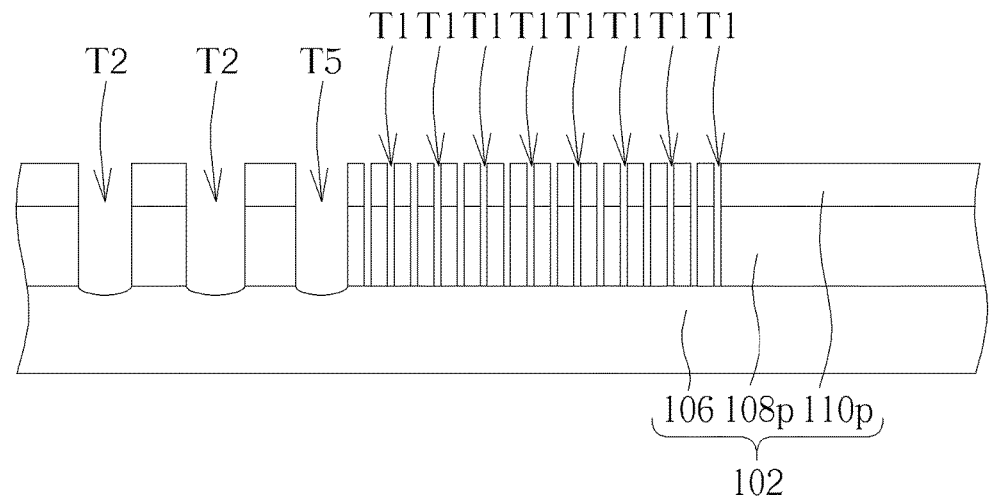

Subsequently, as shown in FIG. 8, the hard mask pattern 104p is used as a mask to etch the substrate 102, so as to form a plurality of first trenches T1 and a plurality of second trench T2 in the substrate 102. Specifically, in this step, the hard mask pattern 104p is used as the mask to etch the pattern transferring layer 110 and the oxide layer 108 until the first trenches T1 and the second trenches T2 penetrate through the pattern transferring layer 110 and the oxide layer 108, so as to form a transfer pattern 110p and an oxide pattern 108p and expose the semiconductor substrate 106. Each first trench T1 is formed by etching the pattern transferring layer 110 and the oxide layer 108 corresponding to one fourth gap G4, and each second trench T2 is formed by etching the pattern transferring layer 110 and the oxide layer 108 corresponding to one second recess R2. Similarly, this step may further form a fifth trench T5 in the substrate 102 corresponding to the third gap G3. Since each trench T2 and the fifth trench T5 are formed by etching the pattern transferring layer 110 and the oxide layer 108 under the pattern transferring layer 110 corresponding to each second recess R2 and the fourth recess R4 respectively, a depth of each second trench T2 and a depth of each fifth trench T5 may be greater than a depth of each first trench T1. Thereafter, the hard mask pattern 104p is removed.

Figure 9:
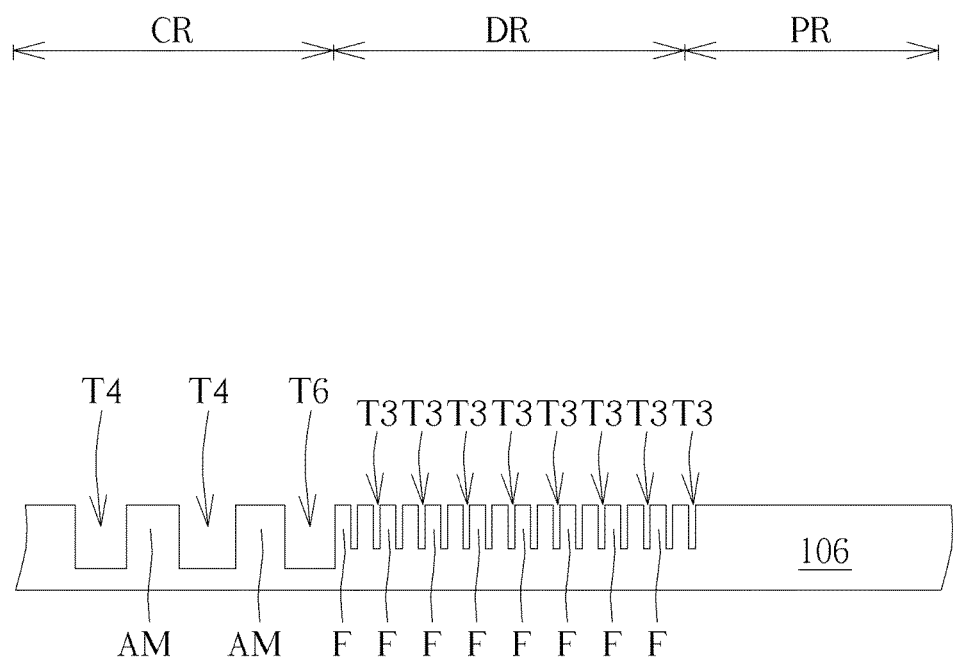

As shown in FIG. 9, a third etching process is then performed to etching the exposed semiconductor substrate 106, so as to form a plurality of third trenches T3 and a plurality of fourth trenches T4 in the semiconductor substrate 106. The third trenches T3 are located in the device region DR, the fourth trenches T4 are located in the cutting line region CR, and a depth of each fourth trench T4 is greater than a depth of each third trench T3. Specifically, the semiconductor substrate 106 may have a plurality of fin structures F in the device region DR and a plurality of alignment mark structures AM in the cutting line region CR. Any two adjacent fin structures may have one of the third trenches T3 between them, and any two adjacent alignment mark structures AM may have one of the fourth trenches T4 between them. In this embodiment, a sixth trench T6 may be formed in the semiconductor substrate 106 corresponding to the fifth trench T5 and between the third trenches T3 and the fourth trenches T4. Additionally, the third etching process of this embodiment may remove the transfer pattern 110p and the oxide pattern 108p at the same time. In another embodiment, the transfer pattern 110p and the oxide pattern 108p may be removed after the third trenches T3 and the fourth trenches T4 are formed.

It is noted that since the depth of the fourth trench T4 in the cutting line region CR is greater than the depth of the third trench T3 in the device region DR, a spacing between the top surface of the alignment mark structure AM in the cutting line region CR and a bottom of the fourth trench T4 may be greater than a spacing between a top surface of the fin structure F and a bottom of the third trench T3. Accordingly, an image contrast between the alignment mark structure AM and the fourth trenches T4 may be increased, thereby improving optical resolution when the optical sensor detects the top surface of the semiconductor substrate 106.

In summary, in the present invention, the mask material layer in the second gaps and the third gap are removed, and the second mask pattern which top surface is lower than the top surface of the first mask pattern remains in the first gap when the mask material layer in the peripheral region is fully removed, such that the following pattern transferring process may form the fourth trench which depth is deeper than the depth of the third trench in the semiconductor substrate in the cutting line region. Accordingly, an image contrast between the alignment mark structure and the fourth trenches may be increased, thereby improving optical resolution.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method for manufacturing a semiconductor device, comprising:

providing a substrate, a hard mask layer and a first mask pattern, wherein the substrate has a device region and a cutting line region, the hard mask layer is disposed on the substrate, and the first mask pattern is disposed on the hard mask layer, and wherein the first mask pattern comprises a plurality of strip-shaped device patterns and a plurality of strip-shaped alignment patterns, each strip-shaped device pattern is disposed along a first direction in the device region, the strip-shaped device patterns are arranged along a second direction, each strip-shaped alignment pattern is disposed along the first direction in the cutting line region, the strip-shaped alignment patterns are arranged along the second direction, a first gap exists between any two of the strip-shaped device patterns adjacent to each other, a second gap exists between any two of the strip-shaped alignment patterns adjacent to each other, and a width of each second gap is greater than a width of each first gap;

forming a spacer layer to conformally cover the first mask pattern;

forming a second mask pattern on the spacer layer in the first gaps, wherein a top surface of the second mask pattern is lower than a top surface of the first mask pattern;

performing a first etching process on the spacer layer to remove a part of the spacer layer between the first mask pattern and the second mask pattern and another part of the spacer layer in the second gaps so as to expose the hard mask layer;

using the first hard mask pattern and the second mask pattern as a mask to pattern the hard mask layer so as to form a hard mask pattern; and using the hard mask pattern as another mask to etch the substrate so as to form a plurality of first trenches and a plurality of second trenches in the substrate, wherein a depth of each second trench is greater than a depth of each first trench.

2. The method for manufacturing the semiconductor device according to claim 1, wherein the width of each second gap is 20 times greater than the width of each first gap.

3. The method for manufacturing the semiconductor device according to claim 1, wherein forming the second mask pattern comprises:

forming a mask material layer on the spacer layer, wherein the mask material layer fills up the first gaps and the second gaps; and performing a second etching process on the mask material layer to remove apart of the mask material layer on the first mask pattern and another part of the mask material layer in the second gaps so as to form the second mask pattern in the first gaps, wherein the second mask pattern comprises a plurality of blocks in the first gaps respectively.

4. The method for manufacturing the semiconductor device according to claim 1, wherein the first etching process further comprises removing a part of the hard mask layer exposed by each second gap to form a plurality of first recesses on the hard mask layer.

5. The method for manufacturing the semiconductor device according to claim 4, wherein the substrate comprises a semiconductor substrate, an oxide layer and a pattern transferring layer, and the oxide layer and the pattern transferring layer are sequentially stacked on the semiconductor substrate, and wherein patterning the hard mask pattern further comprises forming a plurality of second recesses on the pattern transferring layer, and the second recesses correspond to the first recesses respectively.

6. The method for manufacturing the semiconductor device according to claim 5, wherein etching the substrate comprises etching the pattern transferring layer and the oxide layer to form a transfer pattern and an oxide pattern and expose the semiconductor substrate.

7. The method for manufacturing the semiconductor device according to claim 6, further comprising:

removing the hard mask pattern after forming the transfer pattern and the oxide pattern; and performing a third etching process to etch the exposed semiconductor substrate to form a plurality of third trenches and a plurality of fourth trenches on the semiconductor substrate, wherein the third trenches are disposed in the device region, the fourth trenches are disposed in the cutting line region, and a depth of each fourth trench is greater than a depth of each third trench.

8. The method for manufacturing the semiconductor device according to claim 1, wherein a third gap exists between one of the strip-shaped alignment patterns closest to the strip-shaped device patterns and one of the strip-shaped device patterns closest to the strip-shaped alignment patterns, a width of the third gap is greater than the width of each first gap, etching the substrate comprises forming a fifth trench in the substrate corresponding to the third gap.

9. The method for manufacturing the semiconductor device according to claim 1, wherein providing the first mask pattern comprises:

sequentially forming an organic layer and a silicon-containing layer to cover the hard mask layer;

forming a photoresist pattern on the silicon-containing layer;

using the photoresist pattern as another mask to pattern the silicon-containing layer; and patterning the organic layer and removing the photoresist pattern to form the first mask pattern.

* * * * *